United States Patent
Wang

(10) Patent No.: US 7,698,813 B2
(45) Date of Patent: Apr. 20, 2010

(54) METHOD FOR FABRICATING CONDUCTIVE BLIND VIA OF CIRCUIT SUBSTRATE

(75) Inventor: Te-Chun Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 499 days.

(21) Appl. No.: 11/642,660

(22) Filed: Dec. 21, 2006

(65) Prior Publication Data

US 2007/0163112 A1    Jul. 19, 2007

(30) Foreign Application Priority Data

Jan. 16, 2006    (TW) ............................... 95101551 A

(51) Int. Cl.
*H01K 3/10* (2006.01)
(52) U.S. Cl. ............................ 29/852; 29/851; 174/262; 216/94
(58) Field of Classification Search .................. 29/846, 29/851, 852; 174/262; 205/125, 123; 216/18, 216/65–67, 94; 257/774; 438/614, 637, 438/639
See application file for complete search history.

(56) References Cited

U.S. PATENT DOCUMENTS

| 4,642,160 | A | * | 2/1987 | Burgess | 29/852 |
| 5,358,621 | A | * | 10/1994 | Oyama | 205/123 |
| 5,870,822 | A | * | 2/1999 | Drake et al. | 29/852 |
| 6,762,503 | B2 | * | 7/2004 | Lee | 438/614 |

* cited by examiner

*Primary Examiner*—Donghai D. Nguyen
(74) *Attorney, Agent, or Firm*—Rabin & Berdo, P.C.

(57) ABSTRACT

A method for fabricating a conductive blind via of a circuit substrate including the following steps is provided. First, the circuit substrate including a first dielectric layer, a patterned circuit layer and a second dielectric layer are provided. The patterned circuit layer including at least a capture pad is disposed between the first dielectric layer and the second dielectric layer. Next, a blind via exposing the capture pad is formed in the second dielectric layer. Then, an electroless plating process is performed to form an electroless copper layer on the capture pad and an inner wall of the blind via. Next, the electroless copper layer on the capture pad is removed. Finally, the blind via is filled with a conductive material to form the conductive blind via.

9 Claims, 4 Drawing Sheets

METHOD FOR FABRICATING CONDUCTIVE BLIND VIA OF CIRCUIT SUBSTRATE

This application claims the benefit of Taiwan application Serial No. 95101551, filed Jan. 16, 2006, the subject matter of which is incorporated herein by reference.

BACKGROUND OF THE INVENTION

1. Field of the Invention

The invention relates in general to a method for fabricating a circuit substrate, and more particularly to a method for fabricating a conductive blind via of a circuit substrate.

2. Description of the Related Art

Circuit substrates are formed by stacking several dielectric layers and several patterned circuit layers alternately. The patterned circuit layers are defined by lithography and etching a copper layer. The dielectric layers are disposed between the patterned circuit layers for protecting and separating the patterned circuit layers. The patterned circuit layers are electrically connected to each other through conductive blind vias in the dielectric layers. Furthermore, several contacts are formed on surfaces of the circuit substrates for electrically connecting with an outer electronic device. In the present conductor packaging technology, circuit substrates have become the main trend of chip packaging because of the advantages including fine wiring structures and good quality.

FIG. 1 illustrates a conventional circuit substrate. Please referring to FIG. 1, a conventional circuit substrate 100 includes a core layer 110, a patterned circuit layer 120, a dielectric layer 130 and at least a conductive blind via 140. The patterned circuit layer 120 disposed between the core layer 110 and the dielectric layer 130 includes at least a capture pad 122. The capture pad 122 is made of copper. The conductive blind via 140 penetrates the dielectric layer 130 and contacts the capture pad 122.

In the conventional circuit substrate 100, the method for fabricating the conductive blind via 140 includes following steps. First, a blind via 142 penetrating the dielectric layer 130 is formed by laser drilling. The blind via 142 exposes the capture pad 122. Next, an electroless copper layer 144 (composed of sub-micro level copper particles) is formed on the capture pad 122 and an inner wall of the blind via 142 through an electroless plating process. Then, an electroplated copper layer 146 is formed on the electroless copper layer 144 by an electroplating process. The entire blind via 142 is filled with the electroplated copper layer 146. As a result, the conductive blind via 140 is formed by the above steps.

Although the capture pad, the electroless copper layer and the electroplated copper layer are all made of copper in the above circuit substrate, all of them have different microstructures. The electroless copper layer made of sub-micro level copper particles has less strength. Therefore, a portion of the electroless copper layer contacting the capture pad flakes off easily due to thermal stress generated when the circuit substrate is functioning. A bad contact occurs between the conductive blind via and the patterned circuit layer. The electrical connection between the conductive blind via and the patterned circuit layer fails easily. Therefore, reliability of the circuit substrate is lowered.

SUMMARY OF THE INVENTION

The invention is directed to a method for fabricating a conductive blind via of a circuit substrate for increasing reliability of the circuit substrate.

According to the present invention, a method of fabricating a conductive blind via of a circuit substrate is provided. First, a circuit substrate including a first dielectric layer, a patterned circuit layer and a second dielectric layer is provided. The patterned circuit layer disposed between the first dielectric layer and the second dielectric layer includes at least a capture pad. Next, a blind via exposing the capture pad is formed in the second dielectric layer. Then, an electroless process is performed to form an electroless copper layer on the capture pad and an inner wall of the blind via through an electroless process. Afterwards, the electroless copper layer on the capture pad is removed. Subsequently, a conductive material is filled in the blind via to form a conductive blind via.

In an embodiment of the invention, during the step of removing the electroless copper layer on the capture pad, only a portion of the electroless copper layer is removed, so that the inner wall of the blind via is electrically connected to the capture pad.

In an embodiment of the invention, the first dielectric layer is a core layer.

In an embodiment of the invention, the blind via is formed by micro-mechanical drilling.

In an embodiment of the invention, the blind via is formed by laser drilling.

In an embodiment of the invention, the blind via is formed by plasma etching.

In an embodiment of the invention, the conductive material is filled in the blind via by electroplating.

In an embodiment of the invention, the conductive material is made of copper.

In an embodiment of the invention, the electroless copper layer is removed by laser drilling.

According to the present invention, another method for fabricating a conductive blind via of a circuit substrate is provided. This method is similar to the above method. The difference between these two methods is as follow. After the electroless copper layer is formed in the capture pad and the inner wall of the blind via, a copper layer is formed on the electroless copper layer. Next, the electroless copper layer and the copper layer over the capture pad are removed. Then, the conductive material is filled in the blind via to form the conductive blind via.

In an embodiment of the invention, during the step of removing the electroless copper layer and the copper layer on the capture pad, only a portion of the electroless copper layer and the copper layer is removed, so that the inner wall of the blind via is electrically connected to the capture pad.

In an embodiment of the invention, the copper layer is formed by electroplating.

As stated above, the electroless copper layer with less strength on the capture pad is removed by laser drilling or other methods. As a result, the conductive material filled in the blind via is bonded to the capture pad directly to increase the bonding strength between the conductive material and the capture pad. Therefore, reliability of the circuit substrate is increased as well.

The invention will become apparent from the following detailed description of the preferred but non-limiting embodiments. The following description is made with reference to the accompanying drawings.

DETAILED DESCRIPTION OF THE INVENTION

Figure 2A:
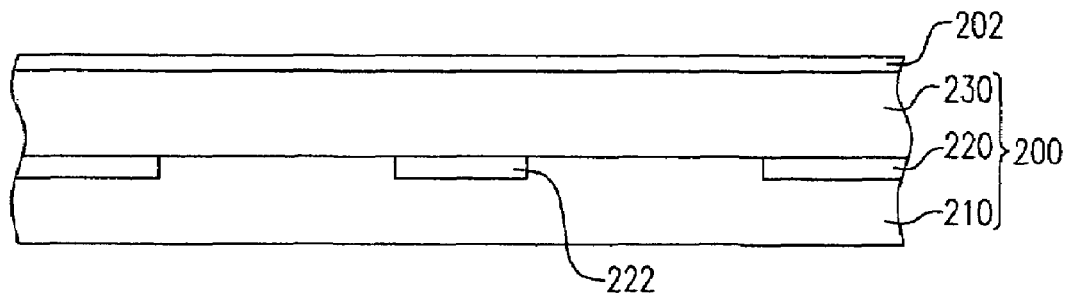
FIGS. 2A~2E illustrates cross-sectional views of a method for fabricating a conductive blind via of a circuit substrate according to a preferred embodiment of the invention.
Figure 2B:
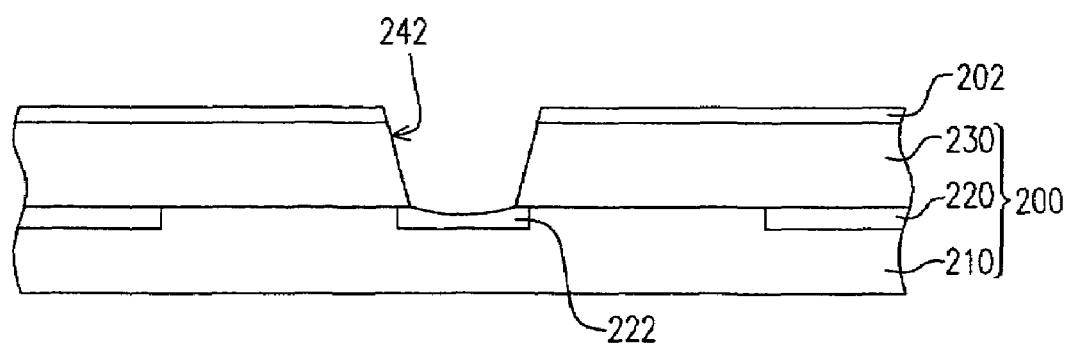
Figure 2C:
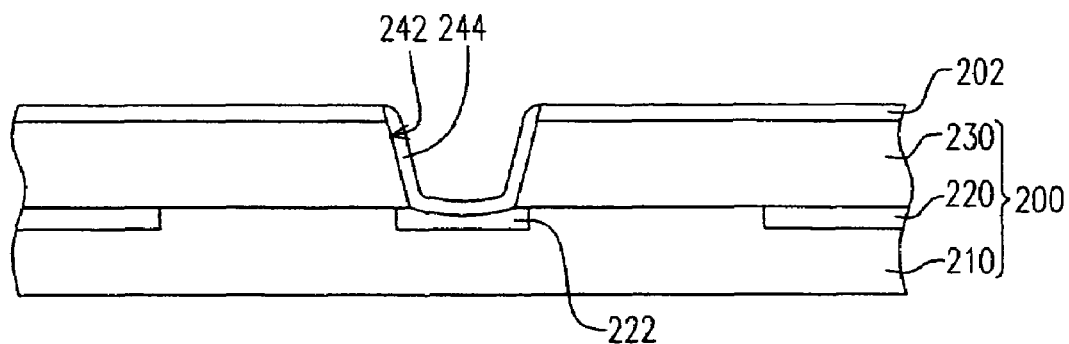

FIGS. 2A~2E illustrates cross-sectional views of a method for fabricating a conductive blind via of a circuit substrate according to a preferred embodiment of the invention. The method includes following steps. First, as shown in FIG. 2A, a circuit substrate 200 is provided. The circuit substrate 200 includes a first dielectric layer 210, a patterned circuit layer 220 and a second dielectric layer 230. The patterned circuit layer 220 is disposed between the first dielectric layer 210 and the second dielectric layer 230. The first dielectric layer 210 is a core layer for example. The patterned circuit layer 220 in the present embodiment preferably includes one or more capture pads 222 (one capture pad 222 illustrated in FIG. 2A as an example). The capture pad 222 is preferably made of copper. In an embodiment, a metal circuit layer 202 is disposed on the second dielectric layer 230. Preferably, the metal circuit layer 202 is electrically connected to the patterned circuit layer 220 (please referring to FIG. 2E) through the conductive blind via 240 fabricated in following steps. Next, as shown in FIG. 2B, a blind via 242 is formed in the second dielectric layer 230. The blind via 242 exposing the capture pad 222 is preferably formed by micro mechanical drilling, laser drilling or plasma etching. Before the blind via 242 is formed in the second dielectric layer 230, the metal circuit layer 202 over the blind via 242 is preferably removed by laser drilling. Afterwards, as shown in FIG. 2C, an electroless copper layer 244 is formed on the capture pad 222 and an inner wall of the blind via 242 through an electroless process. For example, the circuit substrate 200 is soaked in a solution including copper ions, so that the electroless copper layer 244 is formed on the capture pad 222 and the inner wall of the blind via 242.

Figure 2D:
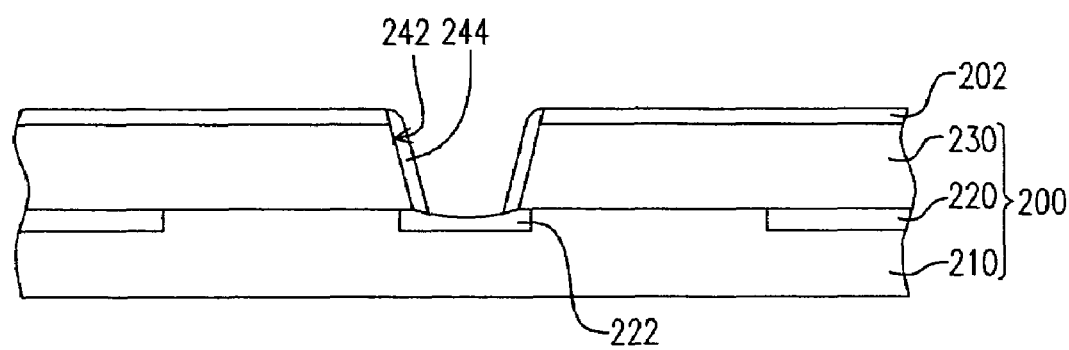
Figure 2E:
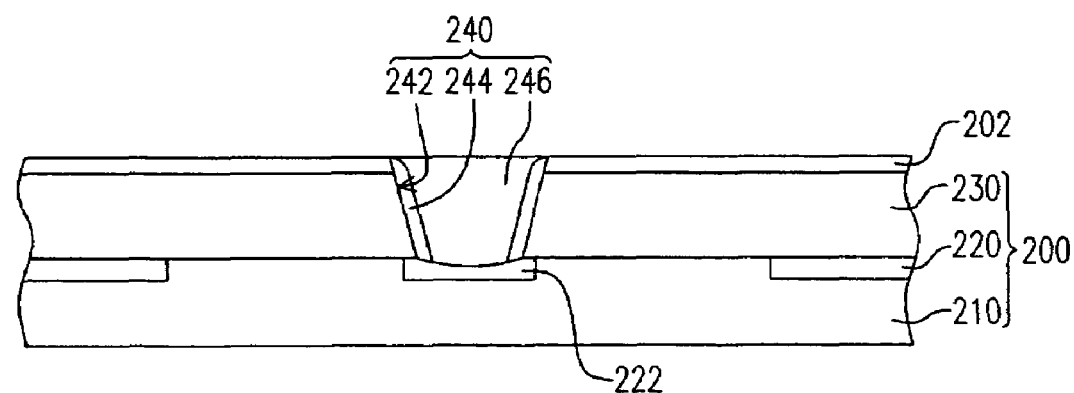

Thereon, as shown in FIG. 2D, the electroless copper layer 244 on the capture pad 222 is removed. For example, the electroless copper layer 244 on the capture pad 222 is removed by laser drilling. During the step of removing the electroless copper layer, for example, only a portion of the electroless copper layer 244 is removed, so that the inner wall of the blind via 242 and the capture pad 222 are still electrically connected to each other. Subsequently, as shown in FIG. 2E, a conductive material 246 is filled in the blind via 242 to form a conductive blind via 240. The conductive material 240 is preferably made of copper. Because the electroless copper layer 244 is formed on the inner wall of the blind via 242, the conductive material 246 is preferably filled in the blind via 242 by electroplating. However, the method used to fill the conductive material 246 in the blind via 242 is not limited thereto.

Figure 1:
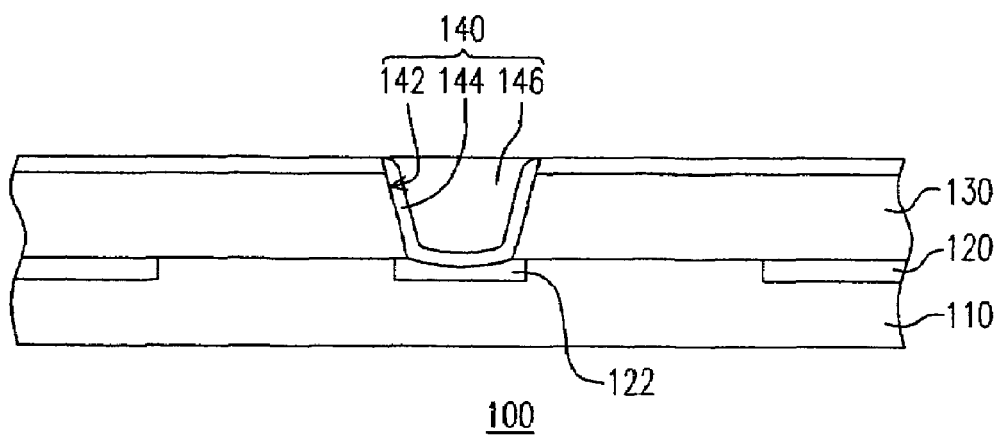
FIG. 1 (Prior Art) is illustrates a conventional circuit substrate.

What is worth mentioning is that the electroless copper layer 244 with less strength on the capture pad 222 is removed. As a result, when the circuit substrate 200 is functioning, the bonding between the conductive blind via 240 and the capture pad 222 is prevented from flaking caused by thermal stress. Therefore, the bonding between the conductive blind via 240 and the capture pad 222 is strengthened. Moreover, the conductive material 246 with better strength is filled in the blind via 242 after the electroless copper layer 244 with less strength on the capture pad 222 is removed. As a result, the conductive material 246 is directly bonded to the capture pad 222, so that the bonding between the conductive blind via 240 and the capture pad 222 is good. The circuit substrate 200 is not affected by the bad bonding between the conductive blind via 240 and the capture pad 222 caused by thermal stress. In other words, reliability of the circuit substrate 200 in the present embodiment is better than that of the conventional circuit substrate 100 (pleasing referring to FIG. 1).

Besides, the method for fabricating a conductive blind via of a circuit substrate of the invention is not limited to the embodiment shown in FIGS. 2A~2E. Another embodiment is illustrated as follow. The same components use the same reference numbers for clarity.

Figure 3A:
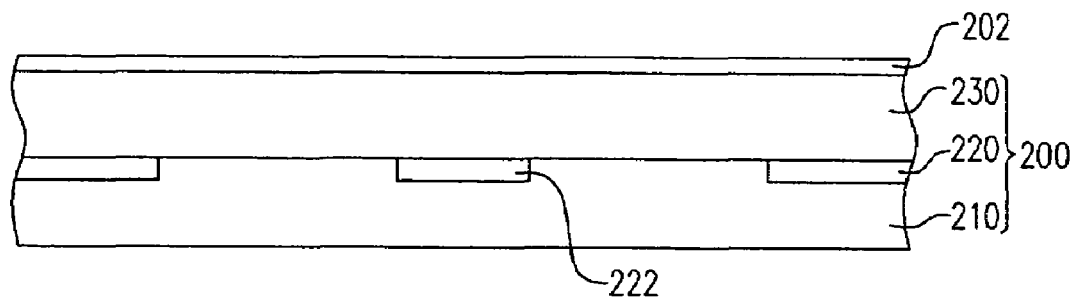
FIGS. 3A~3F illustrate cross-sectional views of a method for fabricating a conductive blind via of a circuit substrate according to a preferred embodiment of the invention.
Figure 3B:
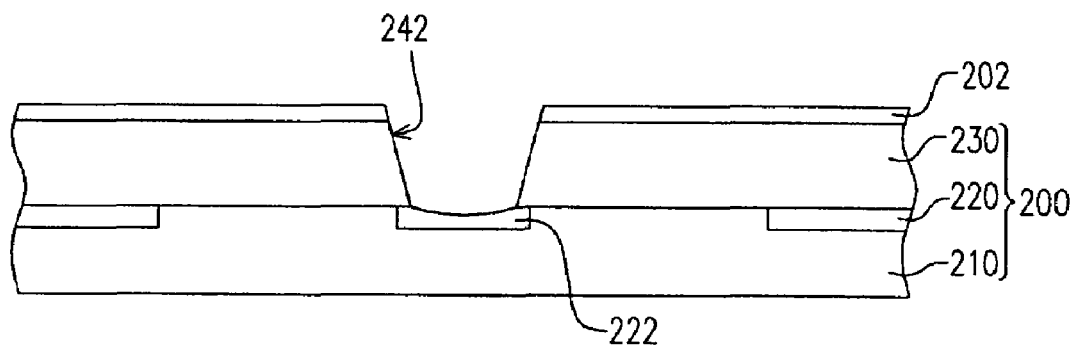
Figure 3C:
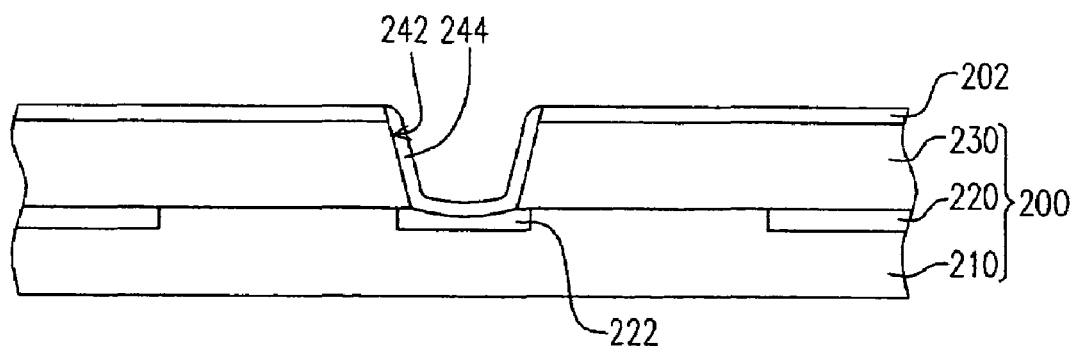
Figure 3D:
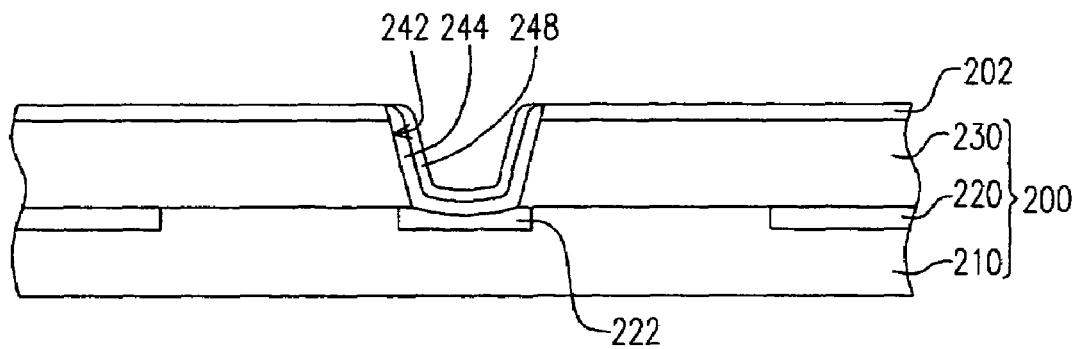
Figure 3E:
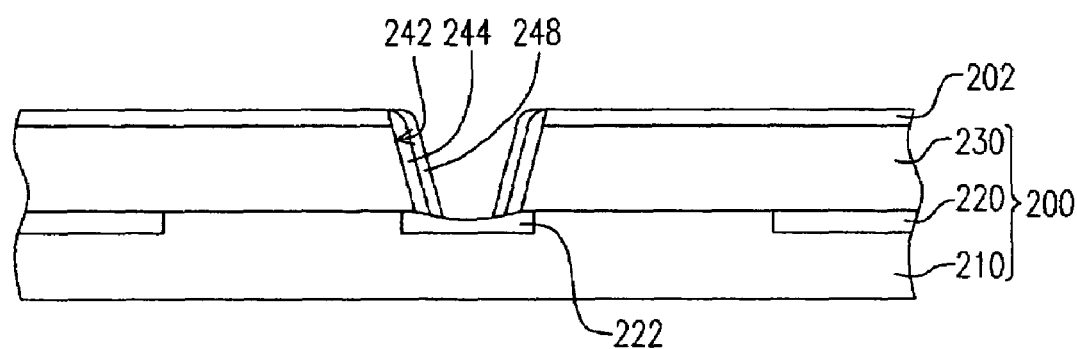
Figure 3F:
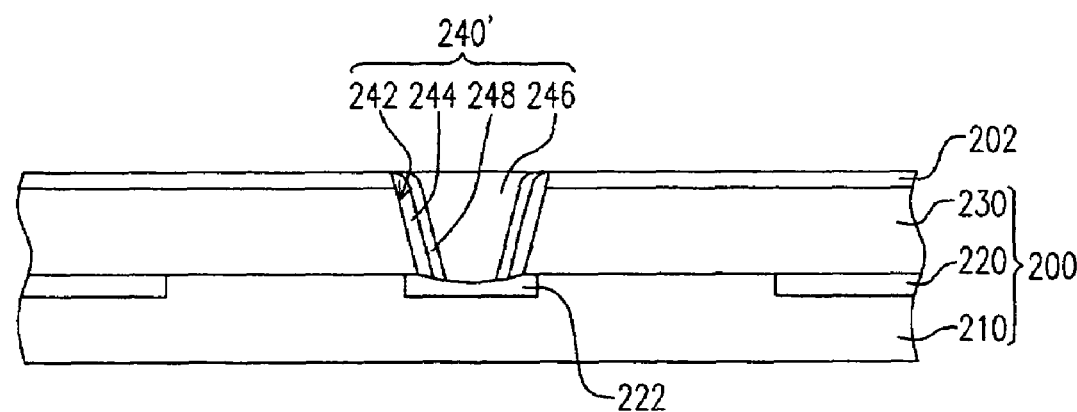

To prevent the electroless copper layer 244 for oxidizing and then affecting the fabricating process of the conductive blind via, another method for fabricating a conductive blind via of a circuit substrate is provided by the invention. FIGS. 3A~3F illustrate cross-sectional views of a method for fabricating a conductive blind via of a circuit substrate according to a preferred embodiment of the invention. Steps shown in FIGS. 3A~3C are the same as those shown in FIGS. 2A~2C and not described redundantly. Steps shown in FIGS. 3D~3F are illustrated as follow.

Please referring to FIG. 3D, after the blind via 242 and the electroless copper layer 244 shown in FIGS. 3A~3C are formed, a copper layer 248 is formed on the electroless copper layer 244. As a result, the electroless copper layer 244 is prevented from oxidizing due to contacting air, and the following steps of fabricating the conductive blind via are not affected. The copper layer 248 is preferably formed on the electroless copper layer 244 by electroplating. Next, as shown in FIG. 3E, the electroless copper layer 244 and the copper layer 248 over the capture pad 222 are removed. In the step of removing the electroless copper layer 244 and the copper layer 248, only a portion of the electroless layer 244 and the copper layer 248 is removed, so that the blind via 242 and the capture pad 222 are electrically connected to each other. The electroless copper layer 244 and the copper layer 248 are preferably removed by laser drilling. Afterwards, please referring to FIG. 3F, the conductive material 246 is filled in the blind via 242 to form the conductive blind via 240' by electroplating or other methods.

In the present embodiment, the copper layer 248 is formed on the electroless copper layer 244 to prevent the electroless layer 244 from oxidizing due to contacting air. Therefore, the conductive material 246 is filled in the blind via 242 successfully.

As stated above, the electroless copper layer with less strength on the capture pad is removed by laser drilling or other methods, so that the conductive material is bonded to the capture pad directly. Therefore, the bonding strength between the conductive material and the capture pad is increased, and liability of the circuit substrate is increased as well.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a conductive blind via of a circuit substrate, the method comprising:
   providing a circuit substrate comprising a first dielectric layer, a patterned circuit layer, a second dielectric layer and a metal circuit layer, wherein the patterned circuit layer is disposed between the first dielectric layer and the second dielectric layer, the metal circuit layer is disposed on the second dielectric layer and opposite to the patterned circuit layer, and the patterned circuit layer comprises at least one capture pad;

forming a blind via extending through the metal circuit layer by laser drilling and the second dielectric layer, wherein the blind via exposes the capture pad;

performing an electroless process to form an electroless copper layer on the capture pad and an inner wall of the blind via;

removing the electroless copper layer on the capture pad; and filling a conductive material in the blind via to form a conductive blind via for electrically connecting the metal circuit layer and the patterned circuit layer.

2. The method according to claim 1, wherein only a portion of the electroless copper layer is removed in the step of removing the electroless copper layer, so that the inner wall of the blind via is electrically connected to the capture pad.

3. The method according to claim 1, wherein the first dielectric layer is a core layer.

4. The method according to claim 1, wherein the blind via is formed in the second dielectric layer by micro-mechanical drilling.

5. The method according to claim 1, wherein the blind via is formed by laser drilling.

6. The method according to claim 1, wherein the blind via is formed in the second dielectric layer by plasma etching.

7. The method according to claim 1, wherein the conductive material is filled in the blind via by electroplating.

8. The method according to claim 1, wherein the conductive material is made of copper.

9. The method according to claim 1, wherein the electroless copper layer is removed by laser drilling.

* * * * *